(12) United States Patent
Jung et al.

(10) Patent No.: US 12,727,180 B2
(45) Date of Patent: Sep. 1, 2026

(54) SEMICONDUCTOR DEVICE

(71) Applicant: Samsung Electronics Co., Ltd., Suwon-si (KR)

(72) Inventors: Kyooho Jung, Suwon-si (KR); Min Hyuk Park, Busan (KR); Hanjin Lim, Suwon-si (KR); Geun Hyeong Park, Seoul (KR); Ju Yong Park, Seoul (KR)

(73) Assignees: SAMSUNG ELECTRONICS CO., LTD.; Pusan National University Industry-University Cooperation

( * ) Notice: Subject to any disclaimer, the term of this patent is extended or adjusted under 35 U.S.C. 154(b) by 727 days.

(21) Appl. No.: 17/988,135

(22) Filed: Nov. 16, 2022

(65) Prior Publication Data

US 2023/0361160 A1 Nov. 9, 2023

(30) Foreign Application Priority Data

May 3, 2022 (KR) ........................ 10-2022-0054762

(51) Int. Cl.
*H10D 1/68* (2025.01)

(52) U.S. Cl.
CPC ............. *H10D 1/684* (2025.01); *H10D 1/692* (2025.01)

(58) Field of Classification Search
CPC ........... H10D 1/684; H10D 1/696; H10D 1/68
See application file for complete search history.

(56) References Cited

U.S. PATENT DOCUMENTS

| | | | |
|---|---|---|---|
| 8,541,868 B2 | 9/2013 | Malhotra et al. | |
| 8,835,310 B2 | 9/2014 | Barabash et al. | |
| 10,825,893 B2 | 11/2020 | Cho et al. | |
| 11,322,578 B2 | 5/2022 | Lim et al. | |
| 2015/0102460 A1* | 4/2015 | Rocklein | H10D 1/692 257/532 |
| 2016/0133691 A1* | 5/2016 | Phatak | H10B 12/03 257/532 |
| 2019/0355804 A1 | 11/2019 | Park et al. | |
| 2021/0125996 A1* | 4/2021 | An | H10D 1/716 |
| 2021/0183718 A1* | 6/2021 | Lee | H01L 23/291 |
| 2021/0359100 A1* | 11/2021 | Maeng | H10B 51/00 |
| 2021/0398990 A1 | 12/2021 | Chia et al. | |

FOREIGN PATENT DOCUMENTS

| | | |
|---|---|---|
| KR | 1020160068940 A | 6/2016 |
| TW | 202121606 A | 6/2021 |
| WO | 2009032575 A2 | 3/2009 |

* cited by examiner

*Primary Examiner* — Sue A Purvis
*Assistant Examiner* — Jordan M Klein
(74) *Attorney, Agent, or Firm* — Muir Patent Law, PLLC

(57) ABSTRACT

Disclosed is a semiconductor device comprising a substrate, a capacitor contact structure electrically connected to the substrate, a bottom electrode connected to the capacitor contact structure, a capacitor dielectric layer on the bottom electrode, and a top electrode on the capacitor dielectric layer. The top electrode includes an interface layer on the capacitor dielectric layer and an electrode layer on the interface layer. The interface layer includes a first layer on the capacitor dielectric layer and a second layer on the first layer. The first layer includes molybdenum and oxygen. The second layer includes molybdenum and nitrogen. The electrode layer includes titanium and nitrogen. A thickness of the interface layer is less than a thickness of the capacitor dielectric layer and a thickness of the electrode layer.

14 Claims, 13 Drawing Sheets

MoNx

FIG. 7A

AP
AP
BT
BT
A1
A1
LEd
GT
GT
LEd
D1
D2
D3

SEMICONDUCTOR DEVICE

CROSS-REFERENCE TO RELATED APPLICATION

This U.S. nonprovisional application claims priority under 35 U.S.C. § 119 to Korean Patent Application No. 10-2022-0054762, filed on May 3, 2022, in the Korean Intellectual Property Office, the disclosure of which is hereby incorporated by reference in its entirety.

BACKGROUND

The present inventive concept relates to a semiconductor device, and more particularly, to a semiconductor device including a capacitor structure.

Semiconductor devices are beneficial in the electronic industry because of their small size, multi-functionality, and/or low fabrication cost. The semiconductor devices may be categorized as any one of semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. The increase in integration of the semiconductor device may induce a reduction in electrical properties and production yield of the semiconductor device. Hence, many studies have been conducted to increase electrical properties and production yield of the semiconductor device.

SUMMARY

Some embodiments of the present inventive concepts provide a semiconductor device with increased reliability and improved electrical properties.

According to some embodiments of the present inventive concepts, a semiconductor device may comprise: a substrate; a capacitor contact structure electrically connected to the substrate; a bottom electrode connected to the capacitor contact structure; a capacitor dielectric layer on the bottom electrode; and a top electrode on the capacitor dielectric layer. The top electrode may include an interface layer on the capacitor dielectric layer and an electrode layer on the interface layer. The interface layer may include a first layer on the capacitor dielectric layer and a second layer on the first layer. The first layer may include molybdenum and oxygen. The second layer may include molybdenum and nitrogen. The electrode layer may include titanium and nitrogen. A thickness of the interface layer may be less than a thickness of the capacitor dielectric layer and a thickness of the electrode layer.

According to some embodiments of the present inventive concepts, a semiconductor device may comprise: a substrate; a capacitor contact structure electrically connected to the substrate; a bottom electrode connected to the capacitor contact structure; a capacitor dielectric layer on the bottom electrode; and a top electrode on the capacitor dielectric layer. The top electrode may include an interface layer on the capacitor dielectric layer and an electrode layer on the interface layer. The interface layer may include molybdenum. The electrode layer may include a metallic element different from a metallic element of the interface layer. A thickness of the interface layer may be less than a thickness of the capacitor dielectric layer and a thickness of the electrode layer.

According to some embodiments of the present inventive concepts, a semiconductor device may comprise: a substrate that includes an active pattern; a bit-line structure electrically connected to the active pattern; a capacitor contact structure electrically connected to the active pattern; a bottom electrode connected to the capacitor contact structure; a supporter that supports the bottom electrode; a capacitor dielectric layer that surrounds the supporter and the bottom electrode; and a top electrode that surrounds the capacitor dielectric layer. The top electrode may include a first layer on the capacitor dielectric layer, a second layer on the first layer, and an electrode layer on the second layer. The first layer may include molybdenum and oxygen. The second layer may include molybdenum and nitrogen. The electrode layer may include nitrogen and a metallic element that is different from a metallic element of the first layer and a metallic element of the second layer. A sum of a thickness of the first layer and a thickness of the second layer may be less than a thickness of the capacitor dielectric layer and a thickness of the electrode layer.

BRIEF DESCRIPTION OF THE DRAWINGS

FIG. 7A illustrates a plan view showing a semiconductor device, according to some example embodiments.

DETAILED DESCRIPTION OF EMBODIMENTS

The following will describe in detail a semiconductor device and its fabrication method according to some embodiments of the present inventive concepts with reference to the accompanying drawings. Like numerals refer to like elements throughout.

Figure 1:
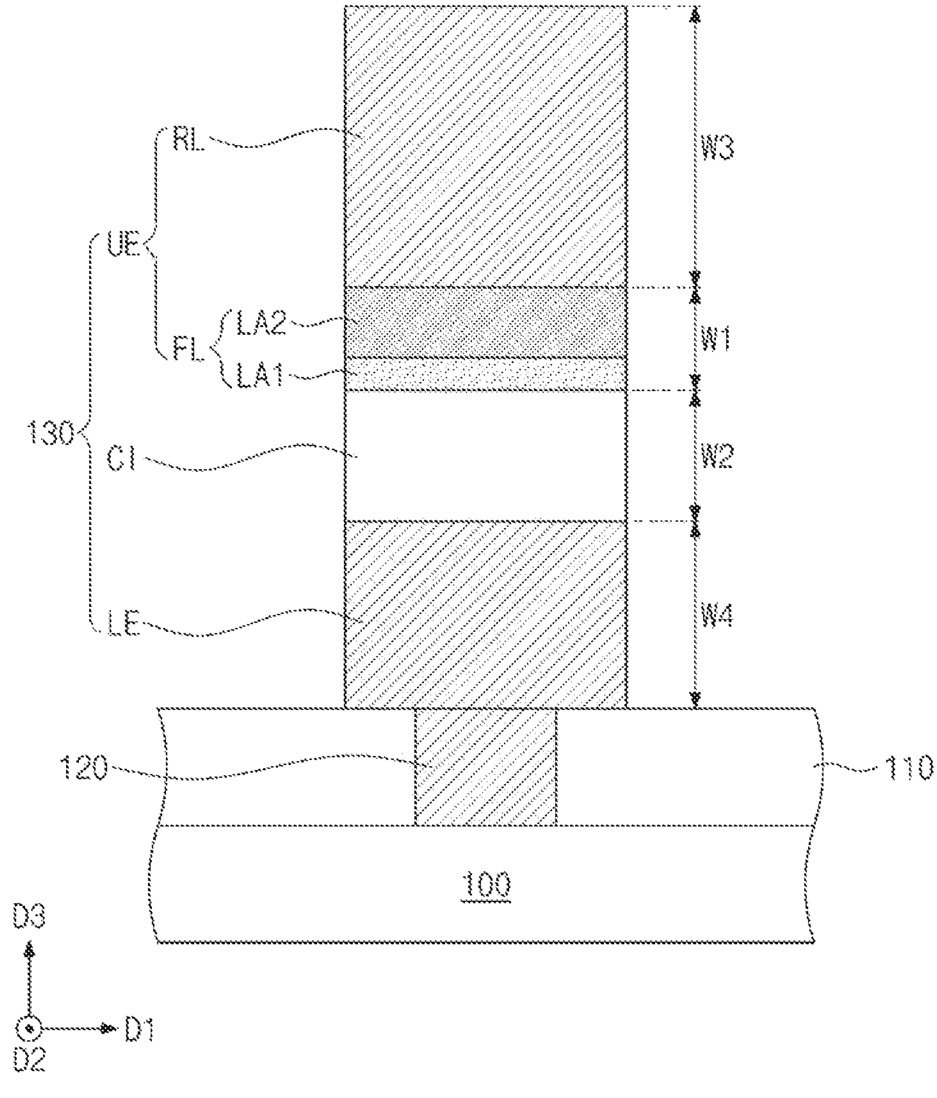
FIG. 1 illustrates a cross-sectional view showing a semiconductor device, according to some example embodiments.

FIG. 1 illustrates a cross-sectional view showing a semiconductor device according to some example embodiments.

Referring to FIG. 1, a semiconductor device may include a substrate 100. In some embodiments, the substrate 100 may be a semiconductor substrate. For example, the substrate 100 may include silicon, germanium, silicon-germanium, GaP, or GaAs. In some embodiments, the substrate 100 may be a silicon-on-insulator (SOI) substrate or a germanium-on-insulator (GOI) substrate. The substrate 100 may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other.

An interlayer dielectric layer 110 may be provided to cover the substrate 100. In some embodiments, the interlayer dielectric layer 110 may be multiple layers including a plurality of dielectric layers.

The interlayer dielectric layer 110 may be provided therein with capacitor contact structures 120. The capacitor contact structure 120 may be electrically connected to the substrate 100. In some embodiments, the capacitor contact structure 120 may be connected to an impurity region formed in the substrate 100. In some embodiments, the capacitor contact structure 120 may be multiple conductive layers including a plurality of conductive layers. As used herein, items described as being "electrically connected" are configured such that an electrical signal can be passed from one item to the other.

A capacitor structure 130 may be provided on the interlayer dielectric layer 110 and the capacitor contact structure 120. The capacitor structure 130 may be electrically connected to the capacitor contact structure 120. The capacitor structure 130 may be electrically connected through the capacitor contact structure 120 to the substrate 100. The capacitor structure 130 may include a bottom electrode LE, a capacitor dielectric layer CI on the bottom electrode LE, and a top electrode UE on the capacitor dielectric layer CI. The capacitor dielectric layer CI may be interposed between the bottom electrode LE and the top electrode UE. For example, a bottom surface of the bottom electrode LE may contact an upper surface of the capacitor contact structure 120, a bottom surface of the capacitor dielectric layer CI may contact an upper surface of the bottom electrode LE, and a bottom surface of the top electrode UE may contact an upper surface of the capacitor dielectric layer CI. As used herein, the term "contact" may refer to a direct connection (i.e., touching) unless the context indicates otherwise.

The bottom electrode LE may include a conductive material. The capacitor dielectric layer CI may include a dielectric material. The capacitor dielectric layer CI may include hafnium oxide. In some embodiments, the capacitor dielectric layer CI may further include oxide other than hafnium oxide. For example, the capacitor dielectric layer CI may further include zirconium oxide, aluminum oxide, lanthanum oxide, tantalum oxide, or titanium oxide.

The top electrode UE may include an interface layer FL on the capacitor dielectric layer CI and an electrode layer RL on the interface layer FL. The interface layer FL may include a first layer LA1 on the capacitor dielectric layer CI and a second layer LA2 on the first layer LA1. A bottom surface of the first layer LA1 may contact an upper surface of the capacitor dielectric layer CI, and a bottom surface of the second layer LA2 may contact an upper surface of the first layer LA1. The electrode layer RL may be provided on the second layer LA2 of the interface layer FL. A bottom surface of the electrode layer RL may contact an upper surface of the second layer LA2. The first and second layers LA1 and LA2 of the interface layer FL may be interposed between the capacitor dielectric layer CI and the electrode layer RL.

The first layer LA1 of the interface layer FL may include molybdenum (Mo) and oxygen (O). For example, the first layer LA1 of the interface layer FL may include molybdenum oxide. The second layer LA2 of the interface layer FL may include a metallic element the same as that of the first layer LA1 of the interface layer FL. The second layer LA2 of the interface layer FL may include a non-metallic element different from that of the first layer LA1 of the interface layer FL. The second layer LA2 of the interface layer FL may include molybdenum (Mo) and nitrogen (N). For example, the second layer LA2 of the interface layer FL may include molybdenum nitride. The electrode layer RL may include a metallic element different from those of the first and second layers LA1 and LA2. The electrode layer RL may include a non-metallic element the same as that of the second layer LA2 of the interface layer FL. The electrode layer RL may include titanium (Ti) and nitrogen (N). For example, the electrode layer RL may include titanium nitride.

In some embodiments, the first layer LA1 of the interface layer FL may further include titanium. For example, the first layer LA1 of the interface layer FL may include molybdenum titanium oxide. In this case, a concentration of titanium in the first layer LA1 of the interface layer FL may be less than a concentration of molybdenum in the first layer LA1 of the interface layer FL. In some embodiments, the second layer LA2 of the interface layer FL may further include titanium. For example, the second layer LA2 of the interface layer FL may include molybdenum titanium nitride. In this case, a concentration of titanium in the second layer LA2 of the interface layer FL may be less than a concentration of molybdenum in the second layer LA2 of the interface layer FL.

A thickness of the interface layer FL may be a sum of thicknesses of the first layer LA1 and the second layer LA2 of the interface layer FL. The thickness of the interface layer FL may be less than that of the capacitor dielectric layer CI, that of the electrode layer RL, and that of the bottom electrode LE. For example, a thickness W1 in a third direction D3 of the interface layer FL may be less than a thickness W2 in the third direction D3 of the capacitor dielectric layer CI, a thickness W3 in the third direction D3 of the electrode layer RL, and a thickness W4 in the third direction D3 of the bottom electrode LE. The third direction D3 may intersect the first direction D1 and the second direction D2. For example, the third direction D3 may be perpendicular to the first direction D1 and the second direction D2. The thickness of the interface layer FL may be, for example, equal to or less than about 15 Å. A sum of thicknesses of the first layer LA1 and the second layer LA2 may be less than a thickness of the capacitor dielectric layer CI, a thickness of the electrode layer RL, and a thickness of the bottom electrode LE.

In the semiconductor device according to some embodiments, because molybdenum is included in the interface layer FL in contact with the capacitor dielectric layer CI, the capacitor dielectric layer CI including hafnium oxide may have a minimum ratio of monoclinic crystal structure. As the capacitor dielectric layer CI has a minimum ratio of monoclinic crystal structure, the capacitor dielectric layer CI may have increased capacitance.

In the semiconductor device according to some embodiments, because molybdenum oxide is included in the first layer LA1 of the interface layer FL, the capacitor structure 130 may have minimized leakage current.

In the semiconductor device according to some embodiments, because molybdenum oxide is included in the second layer LA2 of the interface layer FL, the top electrode UE may have minimized resistivity.

In the semiconductor device according to some embodiments, because the interface layer FL has a thickness less than that of the capacitor dielectric layer CI and that of the electrode layer RL, the top electrode UE may have minimized resistivity.

In the semiconductor device according to some embodiments, because the first layer LA1 and the second layer LA2 of the interface layer FL include molybdenum and titanium whose concentration is less than that of molybdenum, it may be possible to minimize resistivity of the interface layer FL while minimizing a ratio of monoclinic crystal structure of the capacitor dielectric layer CI.

Figure 2:
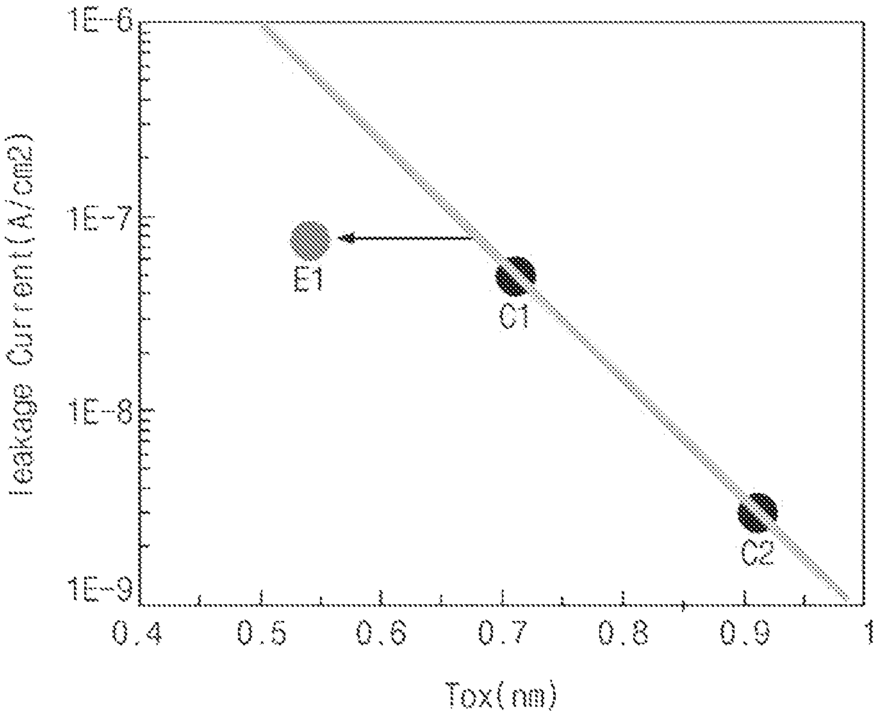
FIG. 2 illustrates a graph showing a measurement result of electrical properties of semiconductor devices.

FIG. 2 illustrates a graph showing a measurement result of electrical properties of semiconductor devices.

FIG. 2 shows measured electrical properties of a semiconductor device E1 according to an embodiment, a semiconductor device C1 according to a first comparative example, and a semiconductor device C2 according to a second comparative example.

In the semiconductor device E1 according to an embodiment, a top electrode includes an interface layer having a thickness of about 15 Å and an electrode layer having a thickness of about 100 Å, which interface layer includes a molybdenum oxide layer on a capacitor dielectric layer and a molybdenum nitride layer on the molybdenum oxide layer, and which electrode layer includes a titanium nitride layer.

In the semiconductor device C1 according to a first comparative example, a top electrode includes a titanium oxide layer on a capacitor dielectric layer and a titanium nitride layer on the titanium oxide layer.

In the semiconductor device C2 according to a second comparative example, a top electrode includes a titanium oxide layer on a capacitor dielectric layer and a titanium nitride layer on the titanium oxide layer.

In the semiconductor device E1 according to an embodiment, a capacitor structure has increased capacitance, and thus the semiconductor device E1 is measured to have a relatively small equivalent oxide thickness Tox versus leakage current.

Figure 3:
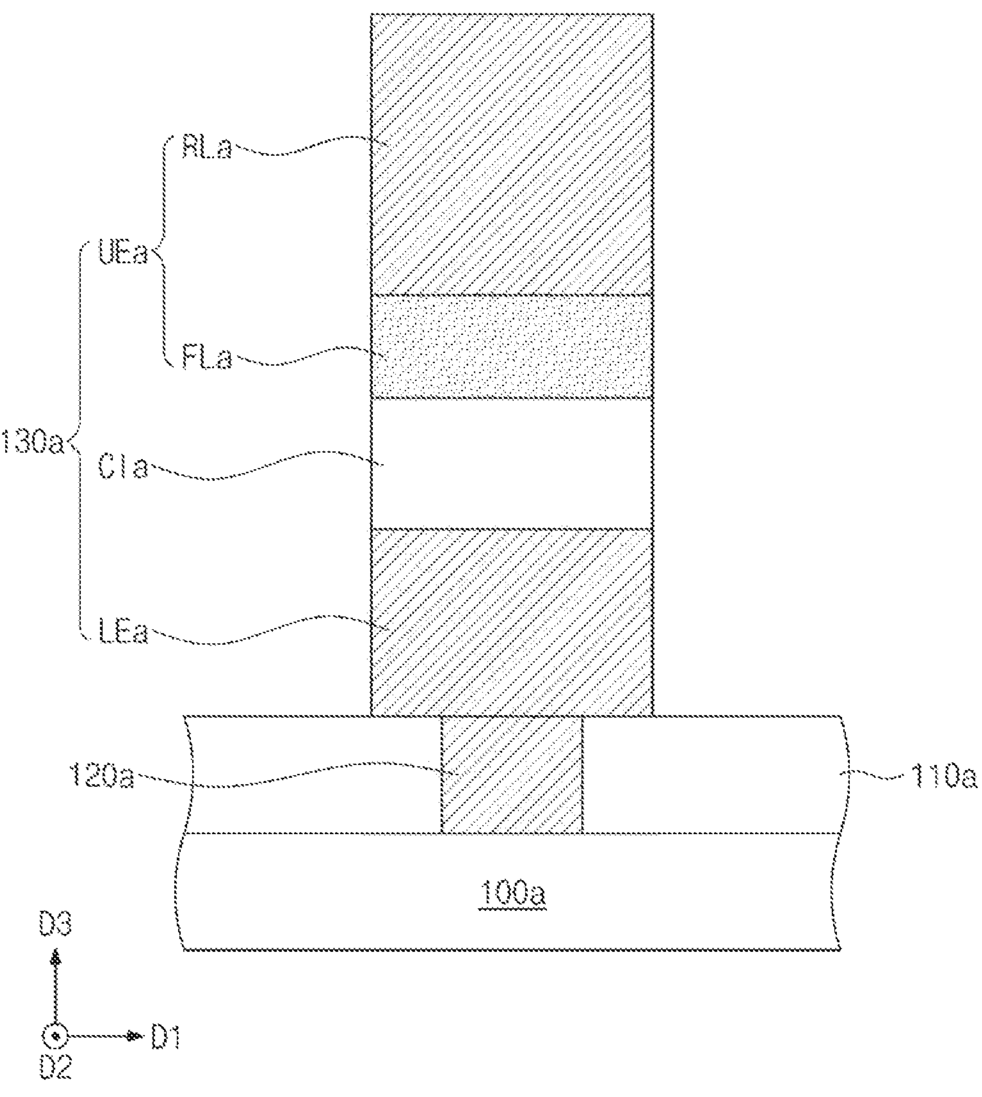
FIG. 3 illustrates a cross-sectional view showing a semiconductor device, according to some example embodiments.

FIG. 3 illustrates a cross-sectional view showing a semiconductor device according to some example embodiments.

Referring to FIG. 3, a semiconductor device may include a substrate 100*a*, an interlayer dielectric layer 110*a*, a capacitor contact structure 120*a*, and a capacitor structure 130*a*. The substrate 100*a*, the interlayer dielectric layer 110*a*, and the capacitor contact structure 120*a* of FIG. 3 may correspond to the substrate 100, the interlayer dielectric layer 110, and the capacitor contact structure 120 of FIG. 1.

The capacitor structure 130*a* may include a bottom electrode LEa, a capacitor dielectric layer CIa on the bottom electrode LEa, and a top electrode UEa on the capacitor dielectric layer CIa. The top electrode UEa may include an interface layer FLa on the capacitor dielectric layer CIa and an electrode layer RLa on the interface layer FLa. For example, a bottom surface of the bottom electrode LEa may contact an upper surface of the capacitor contact structure 120*a*, a bottom surface of the capacitor dielectric layer CIa may contact an upper surface of the bottom electrode LEa, a bottom surface of the interface layer FLa may contact an upper surface of the capacitor dielectric layer CIa, and a bottom surface of the electrode layer RLa may contact an upper surface of the interface layer FLa.

The interface layer FLa may include molybdenum and oxygen. For example, the interface layer FLa may include molybdenum oxide. The electrode layer RLa may include a metallic element different from that of the interface layer FLa. The electrode layer RLa may include a non-metallic element different from that of the interface layer FLa. The electrode layer RLa may include titanium and nitrogen. For example, the electrode layer RLa may include titanium nitride.

In some embodiments, the interface layer FLa may further include titanium. For example, the interface layer FLa may include molybdenum titanium oxide. In this case, a concentration of titanium in the interface layer FLa may be less than a concentration of molybdenum in the interface layer FLa.

Figure 4:
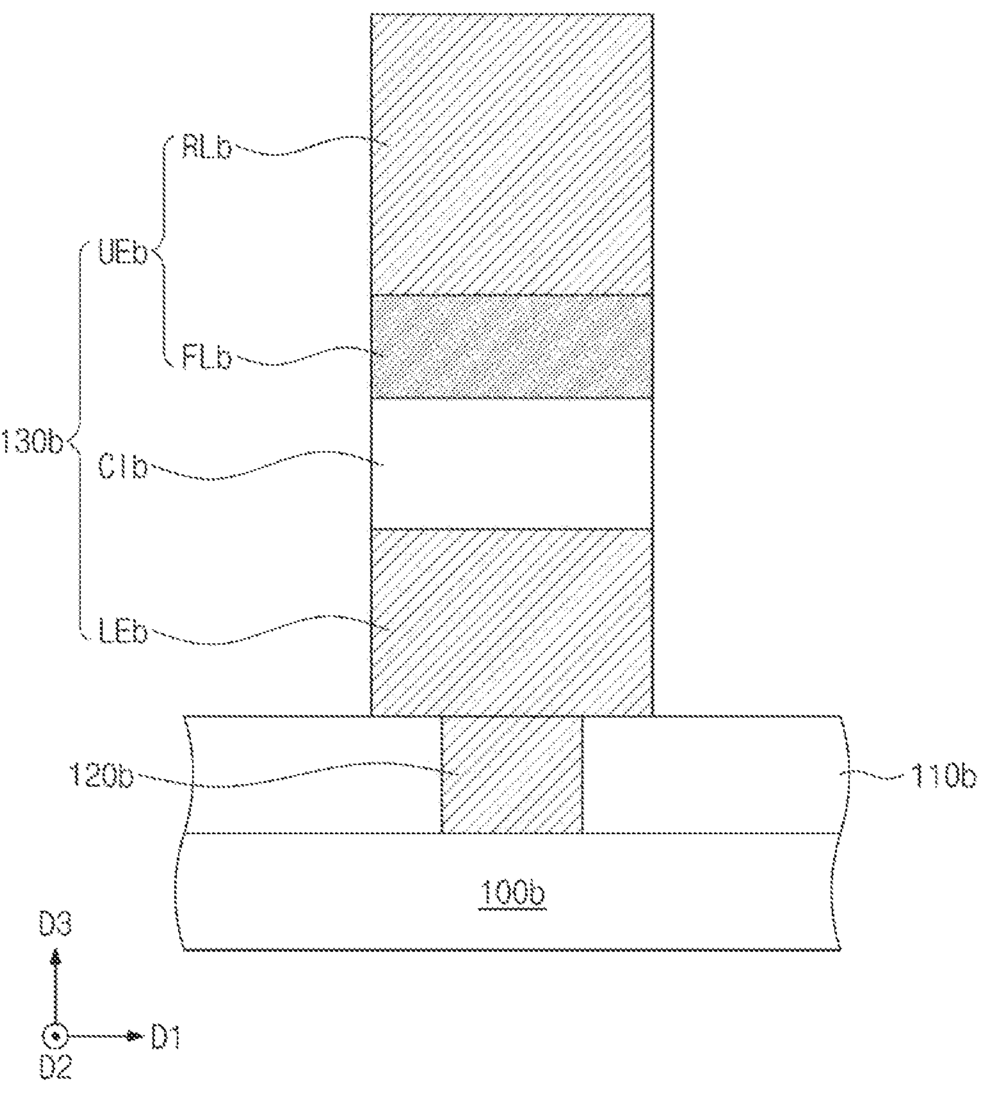
FIG. 4 illustrates a cross-sectional view showing a semiconductor device, according to some example embodiments.

FIG. 4 illustrates a cross-sectional view showing a semiconductor device according to some example embodiments.

Referring to FIG. 4, a semiconductor device may include a substrate 100*b*, an interlayer dielectric layer 110*b*, a capacitor contact structure 120*b*, and a capacitor structure 130*b*. The substrate 100*b*, the interlayer dielectric layer 110*b*, and the capacitor contact structure 120*b* of FIG. 4 may correspond to the substrate 100, the interlayer dielectric layer 110, and the capacitor contact structure 120 of FIG. 1.

The capacitor structure 130*b* may include a bottom electrode LEb, a capacitor dielectric layer CIb on the bottom electrode LEb, and a top electrode UEb on the capacitor dielectric layer CIb. The top electrode UEb may include an interface layer FLb on the capacitor dielectric layer CIb and an electrode layer RLb on the interface layer FLb. For example, a bottom surface of the bottom electrode LEb may contact an upper surface of the capacitor contact structure 120*b*, a bottom surface of the capacitor dielectric layer CIb may contact an upper surface of the bottom electrode LEb, a bottom surface of the interface layer FLb may contact an upper surface of the capacitor dielectric layer CIb, and a bottom surface of the electrode layer RLb may contact an upper surface of the interface layer FLb.

The interface layer FLb may include molybdenum and nitrogen. For example, the interface layer FLb may include molybdenum nitride. The electrode layer RLb may include a metallic element different from that of the interface layer FLb. The electrode layer RLb may include a non-metallic element different from that of the interface layer FLb. The electrode layer RLb may include titanium and nitrogen. For example, the electrode layer RLb may include titanium nitride.

In some embodiments, the interface layer FLb may further include titanium. For example, the interface layer FLb may include molybdenum titanium nitride. In this case, a concentration of titanium in the interface layer FLb may be less than a concentration of molybdenum in the interface layer FLb.

Figure 5:
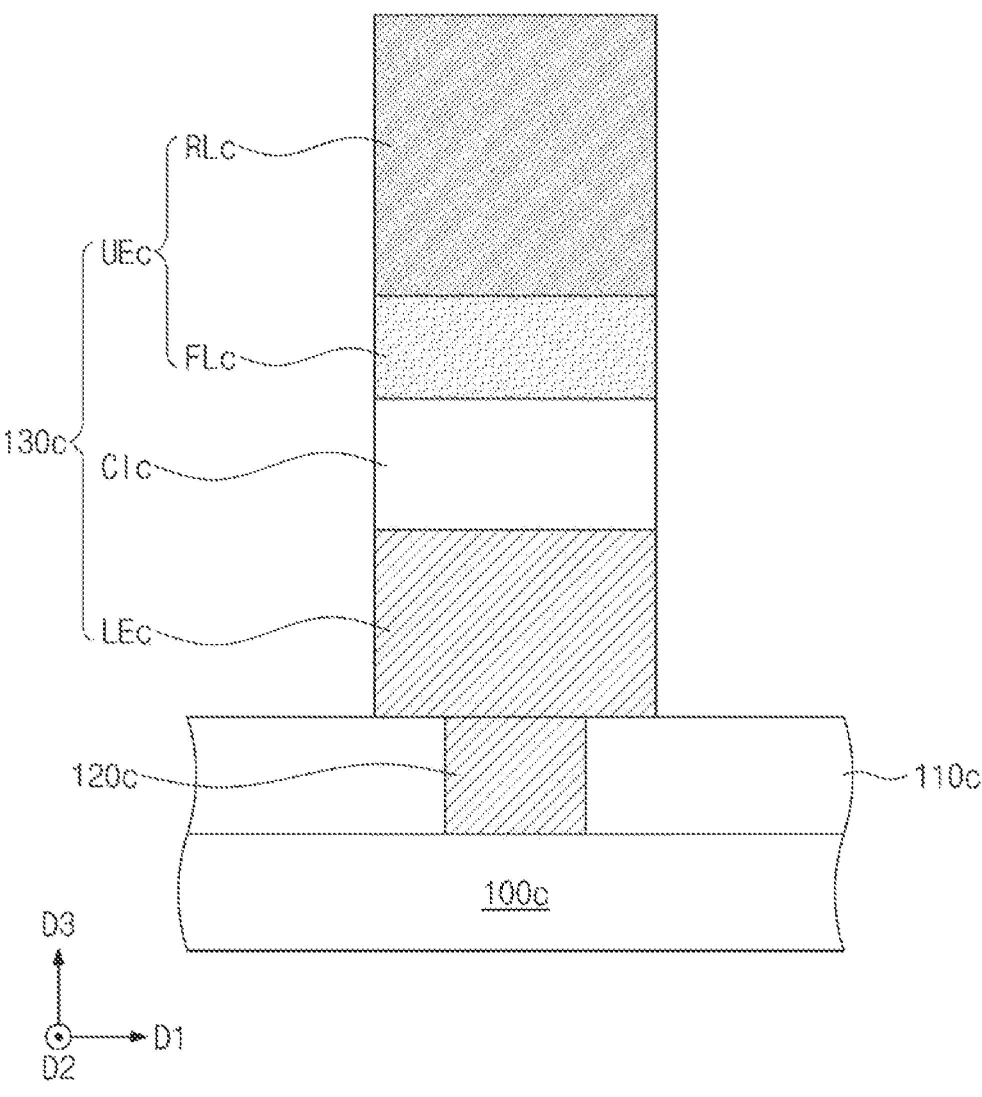
FIG. 5 illustrates a cross-sectional view showing a semiconductor device, according to some example embodiments.

FIG. 5 illustrates a cross-sectional view showing a semiconductor device according to some example embodiments.

Referring to FIG. 5, a semiconductor device may include a substrate 100*c*, an interlayer dielectric layer 110*c*, a capacitor contact structure 120*c*, and a capacitor structure 130*c*. The substrate 100*c*, the interlayer dielectric layer 110*c*, and the capacitor contact structure 120*c* of FIG. 5 may correspond to the substrate 100, the interlayer dielectric layer 110, and the capacitor contact structure 120 of FIG. 1.

The capacitor structure 130*c* may include a bottom electrode LEc, a capacitor dielectric layer CIc, and a top electrode UEc on the capacitor dielectric layer CIc. The top electrode UEc may include an interface layer FLc on the capacitor dielectric layer CIc and an electrode layer RLc on the interface layer FLc. For example, a bottom surface of the bottom electrode LEc may contact an upper surface of the capacitor contact structure 120*c*, a bottom surface of the capacitor dielectric layer CIc may contact an upper surface of the bottom electrode LEc, a bottom surface of the interface layer FLc may contact an upper surface of the capacitor dielectric layer CIc, and a bottom surface of the electrode layer RLc may contact an upper surface of the interface layer FLc.

The interface layer FLc may include molybdenum and oxygen. For example, the interface layer FLc may include molybdenum oxide. The electrode layer RLc may include a metallic element the same as that of the interface layer FLc. The electrode layer RLc may include a non-metallic element different from that of the interface layer FLc. The electrode layer RLc may include molybdenum and nitrogen. For example, the electrode layer RLc may include molybdenum nitride.

In some embodiments, the interface layer FLc may further include titanium. For example, the interface layer FLc may include molybdenum titanium oxide. In this case, a concentration of titanium in the interface layer FLc may be less than a concentration of molybdenum in the interface layer FLc.

In some embodiments, the electrode layer RLc may further include titanium. For example, the electrode layer RLc may include molybdenum titanium nitride. In this case, a concentration of titanium in the electrode layer RLc may be less than a concentration of molybdenum in the electrode layer RLc.

Figure 6A:
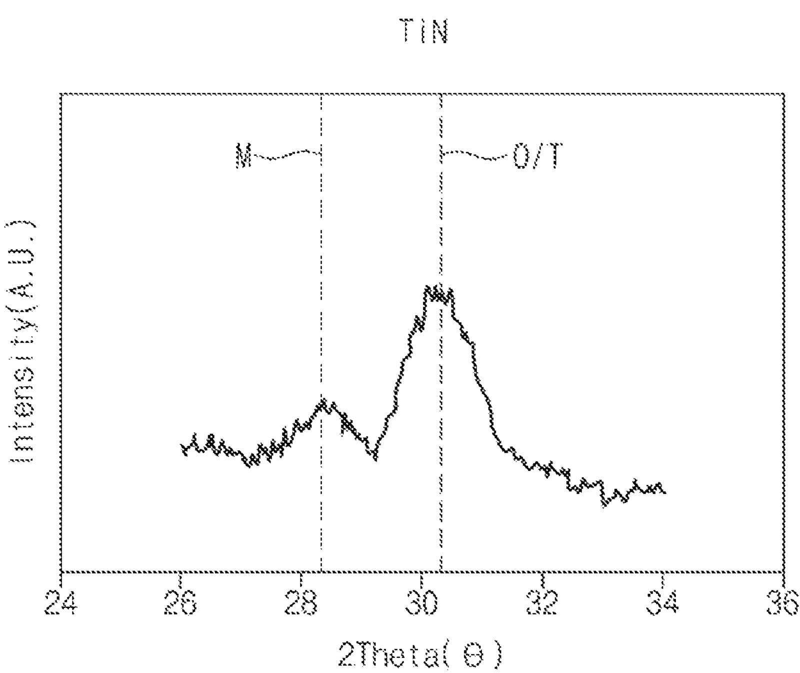
FIGS. 6A, 6B, and 6C illustrate graphs showing an X-ray diffraction (XRD) result of a capacitor dielectric layer in accordance with a material included in an interface layer.
Figure 6B:
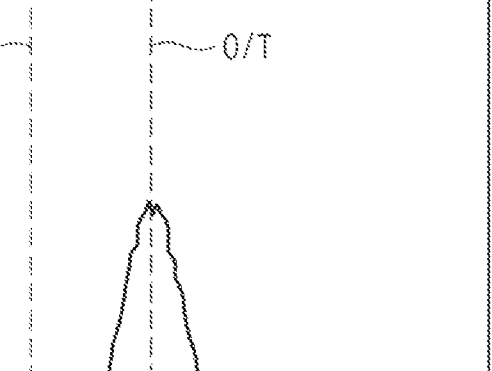
Figure 6C:
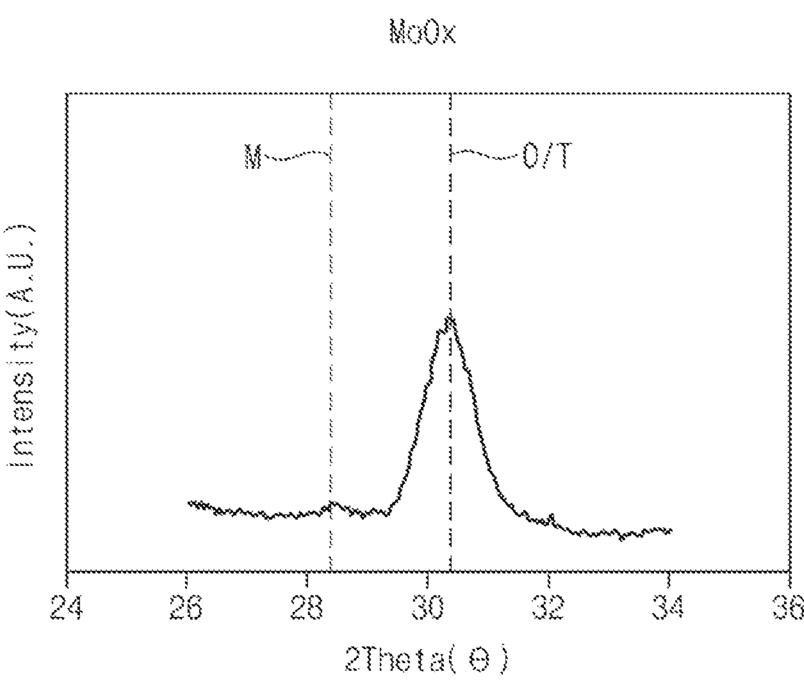

FIGS. 6A, 6B, and 6C illustrate graphs showing an X-ray diffraction (XRD) result of a capacitor dielectric layer in accordance with a material included in an interface layer. For example, FIGS. 6A, 6B, and 6C illustrate diffraction spectrums consisting of plots of reflected intensity (y-axis) versus the detector angle 2Theta (x-axis).

FIG. 6A shows a result measured from a crystal structure of a capacitor dielectric layer in a structure in which the capacitor dielectric layer including hafnium oxide is in contact with a titanium nitride (TiN) layer. FIG. 6B shows a result measured from a crystal structure of a capacitor dielectric layer in a structure in which the capacitor dielectric layer including hafnium oxide is in contact with a molybdenum nitride (MoNx) layer. FIG. 6C shows a result measured from a crystal structure of a capacitor dielectric layer in a structure in which the capacitor dielectric layer including hafnium oxide is in contact with a molybdenum oxide (MoOx) layer.

Referring to FIG. 6A, it is ascertained that a capacitor dielectric layer in contact with a titanium nitride layer (TiN) includes an orthorhombic crystal structure O, a tetragonal crystal structure T, and a monoclinic crystal structure M.

Referring to FIG. 6B, it is ascertained that a capacitor dielectric layer in contact with a molybdenum nitride (MoNx) layer includes an orthorhombic crystal structure O and a tetragonal crystal structure T, and that a ratio of monoclinic crystal structure M is minimized.

Referring to FIG. 6C, it is ascertained that a capacitor dielectric layer in contact with a molybdenum oxide (MoOx) layer includes an orthorhombic crystal structure O and a tetragonal crystal structure T, and that a ratio of monoclinic crystal structure M is minimized.

Figure 7A:
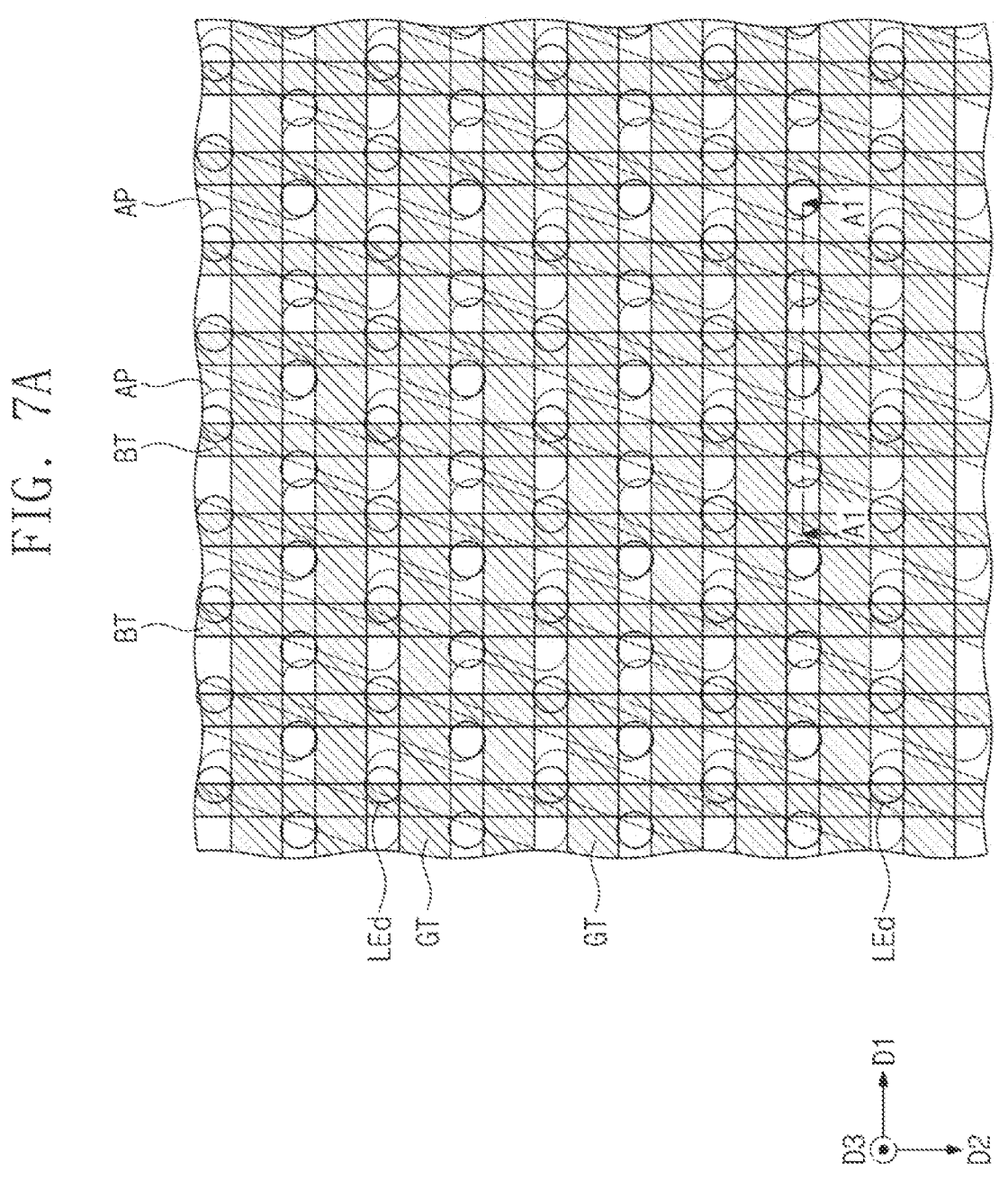
Figure 7B:
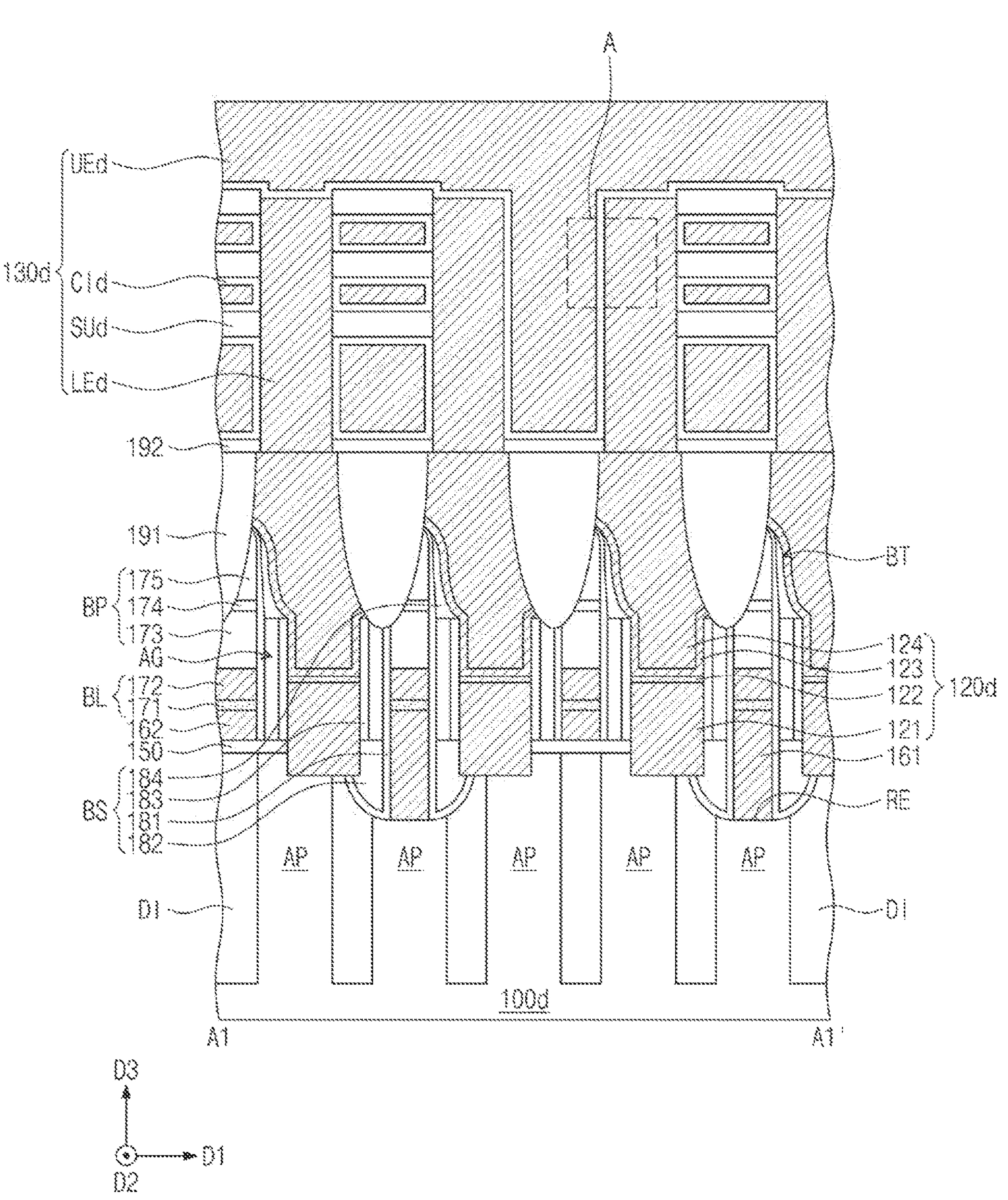
FIG. 7B illustrates a cross-sectional view taken along line A1-A1' of FIG. 7A.
Figure 7C:
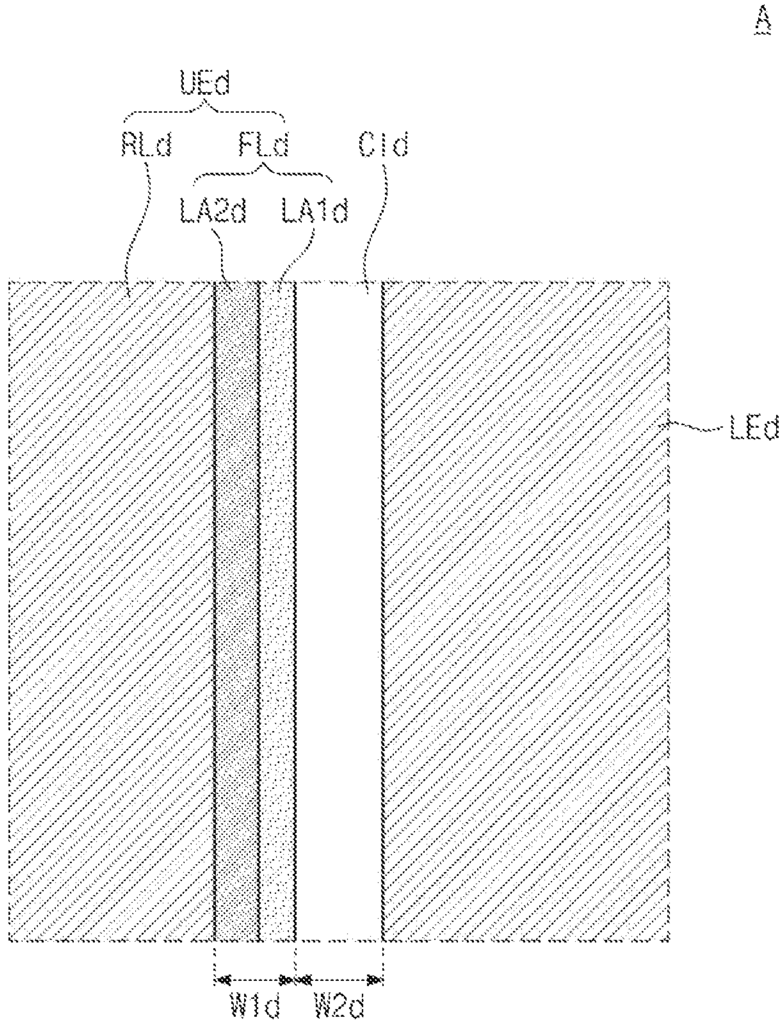
FIG. 7C illustrates an enlarged view showing section A of FIG. 7B.

FIG. 7A illustrates a plan view showing a semiconductor device according to some embodiments. FIG. 7B illustrates a cross-sectional view taken along line A1-A1' of FIG. 7A. FIG. 7C illustrates an enlarged view showing section A of FIG. 7B.

Referring to FIGS. 7A and 7B, a semiconductor device may include a substrate 100*d*.

The substrate 100*d* may include active patterns AP. The substrate 100*d* may have their upper portions that extend in a third direction D3, and the upper portions of the substrate 100*d* may be defined as the active patterns AP. The active patterns AP may be spaced apart from each other. Substrate 100*d* may correspond to substrate 100 of FIG. 1.

A device isolation layer DI may be provided in a space between the active patterns AP. The active patterns AP may be defined by the device isolation layer DI. Each of the active patterns AP may be surrounded by the device isolation layer DI. The device isolation layer DI may include a dielectric material. For example, the device isolation layer DI may include oxide.

Gate structures GT may be provided which extend lengthwise in a first direction D1. The gate structures GT may be spaced apart from each other in a second direction D2, and may be provided in parallel with one another. The gate structure GT may be provided on the device isolation layer DI and the active patterns AP. The gate structure GT may be a buried gate structure that is buried in the active patterns AP and the device isolation layer DI. The active patterns AP may include impurity regions. The gate structure GT and the active pattern AP may define a cell transistor.

A dielectric pattern 150 may be provided on the substrate 100*d*. In some embodiments, the dielectric pattern 150 may be a multiple dielectric layer. Recesses RE may be defined by the dielectric pattern 150, the device isolation layer DI, and the active pattern AP of the substrate 100.

Bit-line structures BT may be provided which extend lengthwise in the second direction D2. The bit-line structures BT may be spaced apart from each other in the first direction D1, and may be provided in parallel with one another. The bit-line structure BT may be provided on the dielectric pattern 150 and the active pattern AP. The bit-line structure BT may be electrically connected to the active pattern AP.

Each of the bit-line structures BT may include a bit line BL, a bit-line capping layer BP, bit-line spacers BS, bit-line contacts 161, and polysilicon patterns 162.

The bit-line contacts 161 may be provided in corresponding recesses RE. The bit-line contact 161 may be connected through the recess RE to the active pattern AP. For example, the bit-line contact 161 may contact the active pattern AP in the recess RE. The polysilicon patterns 162 may be provided on the dielectric pattern 150. For example, a lower surface of the polysilicon patterns 162 may contact an upper surface of the dielectric pattern 150. The bit-line contacts 161 and the polysilicon patterns 162 of the bit-line structure BT may be alternately disposed along the second direction D2.

The bit line BL may be provided on the bit-line contact 161 and the polysilicon pattern 162. The bit line BL may include a first line pattern 171 and a second line pattern 172 on the first line pattern 171. The first line pattern 171 and the second line pattern 172 may extend lengthwise in the second direction D2. The first and second line patterns 171 and 172 may include a conductive material. For example, the first line pattern 171 may include metal silicide, and the second line pattern 172 may include tungsten.

The bit-line capping layer BP may be provided on the bit line BL. The bit-line capping layer BP may include a first capping pattern 173, a second capping pattern 174 on the first capping pattern 173, and a third capping pattern 175 on the second capping pattern 174. The first, second, and third capping patterns 173, 174, and 175 may include a dielectric material.

The bit-line spacers BS may be provided on opposite sides of the bit-line capping layer BP, the bit line BL, the bit-line contacts 161, and the polysilicon patterns 162. Each of the bit-line spacers BS may include a first spacer pattern 181, a second spacer pattern 182, a third spacer pattern 183, and a fourth spacer pattern 184.

The first spacer pattern 181 may cover sidewalls of the bit-line capping layer BP, the bit line BL, the bit-line contacts 161, and the polysilicon patterns 162. The first spacer pattern 181 may cover surfaces of the device isolation layer DI and the active pattern AP, which surfaces define the recess RE. The second spacer pattern 182 may be provided on the first spacer pattern 181, filling the recess RE. The third spacer pattern 183 may be provided on the second spacer pattern 182. The third spacer pattern 183 may be spaced apart in the first direction D1 from the first spacer pattern 181. An air gap AG may be provided between the first and third spacer patterns 181 and 183. A fourth spacer pattern 184 may be provided on the first and third spacer patterns 181 and 183. The fourth spacer pattern 184 may cover the air gap AG. For example, the first, second, third, and fourth spacer patterns 181, 182, 183, and 184 may surround the air gap GP. The first, second, third, and fourth spacer patterns 181, 182, 183, and 184 may include a dielectric material.

Capacitor contact structures 120*d* may be provided which are connected to the active patterns AP of the substrate 100*d*. Each of the capacitor contact structures 120*d* may include a buried contact 121, an ohmic pattern 122, a barrier layer 123, and a landing pad 124. In example embodiments, the capacitor contact structures 120*d* may correspond to any of the capacitor contact structures 120, 120*a*, 120*b*, or 120*c*.

The buried contact 121 may be connected to the active pattern AP. The buried contact 121 may be provided between the bit-line spacers BS. The ohmic pattern 122 may be provided on the buried contact 121. The barrier layer 123 may cover the ohmic pattern 122 and the bit-line spacer BS. The landing pad 124 may be provided on the barrier layer 123. The buried contact 121, the ohmic pattern 122, the barrier layer 123, and the landing pad 124 may include a conductive material. For example, the buried contact 121 may include polysilicon, the ohmic pattern 122 may include metal silicide, the barrier layer 123 may include titanium nitride or tantalum nitride, and the landing pad 124 may include tungsten.

A filling pattern 191 may be provided on the bit-line structure BT. The filling pattern 191 may separate the landing pads 124 from each other. An etch stop layer 192 may be provided on the filling pattern 191. The filling pattern 191 and the etch stop layer 192 each may include a dielectric material.

A capacitor structure 130*d* may be provided on the etch stop layer 192 and the capacitor contact structure 120*d*. The capacitor structure 130*d* may include bottom electrodes LEd, supporters SUd that support the bottom electrodes LEd, a capacitor dielectric layer CId that covers the bottom electrodes LEd and the supporters SUd, and a top electrode UEd that covers the capacitor dielectric layer CId.

The capacitor structure 130*d* may be connected to the landing pad 124 of the capacitor contact structure 120*d*. The capacitor structure 130*d* may be electrically connected to the active pattern AP through the landing pad 124, the barrier layer 123, the ohmic pattern 122, and the buried contact 121 of the capacitor contact structure 120*d*.

Referring to FIG. 7C, the top electrode UEd may include an interface layer FLd on the capacitor dielectric layer CId and an electrode layer RLd on the interface layer FLd. In some embodiments, the interface layer FLd may include a first layer LA1*d* on the capacitor dielectric layer CId and a second layer LA2*d* on the first layer LA1*d*. The electrode layer RLd may be provided on the second layer LA2*d* of the interface layer FLd.

The capacitor dielectric layer CId may include hafnium oxide. In some embodiments, the capacitor dielectric layer CId may further include oxide other than hafnium oxide.

The first layer LA1*d* of the interface layer FLd may include molybdenum and oxygen. In some embodiments, the first layer LA1*d* of the interface layer FLd may further include titanium. The second layer LA2*d* of the interface layer FLd may include molybdenum and nitride. In some embodiments, the second layer LA2*d* of the interface layer FLd may further include titanium. The electrode layer RLd may include titanium and nitrogen.

The interface layer FLd may have a thickness less than that of the capacitor dielectric layer CId, that of the electrode layer RLd, and that of the bottom electrode LEd. For example, a thickness W1*d* in a first direction D1 of the interface layer FLd may be less than a thickness W2*d* in the first direction D1 of the capacitor dielectric layer CId, a thickness in the first direction D1 of the electrode layer RLd, and a thickness in the first direction D1 of the bottom electrode LEd.

Figure 8A:
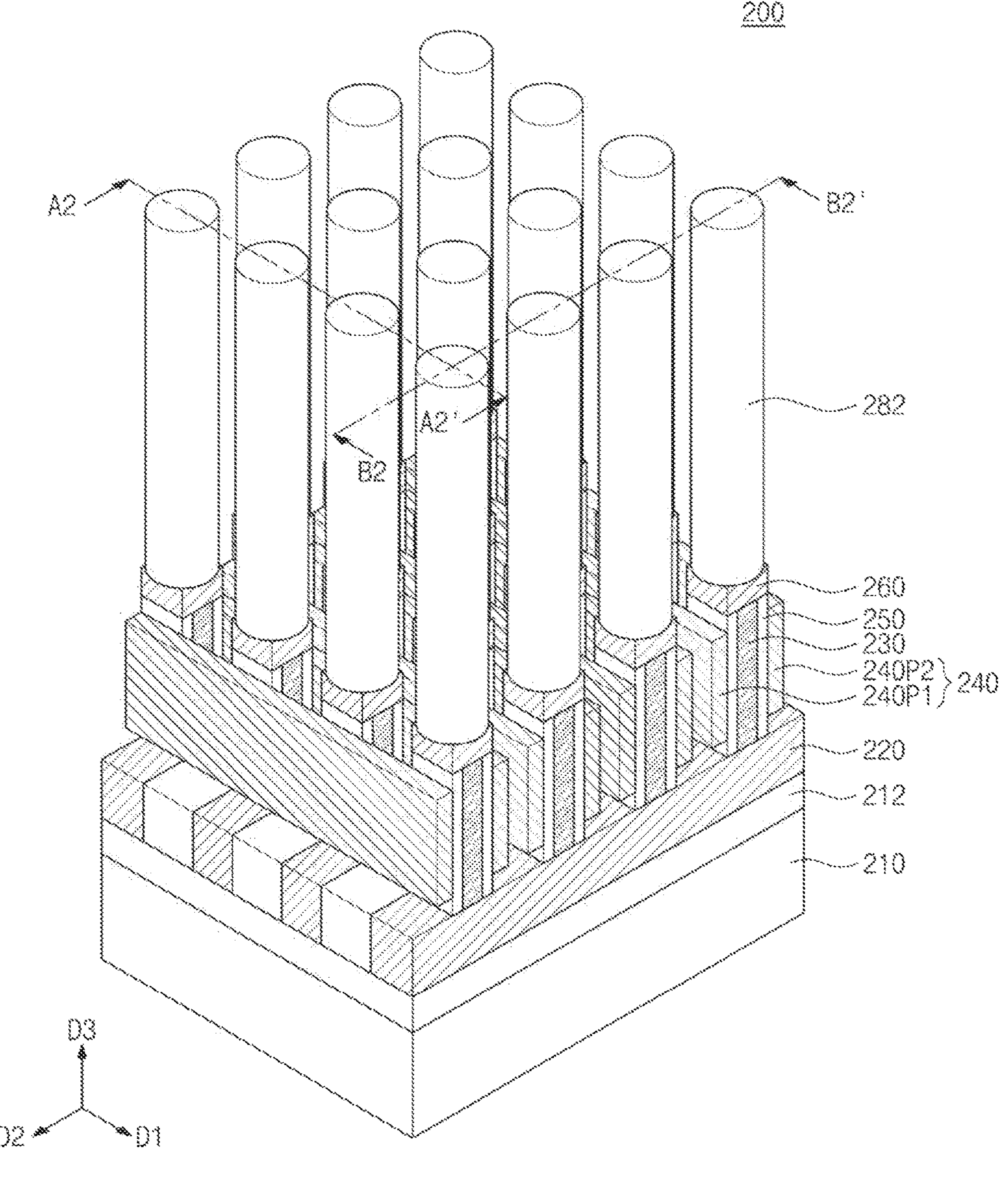
FIG. 8A illustrates a perspective view showing a semiconductor device, according to some example embodiments.
Figure 8B:
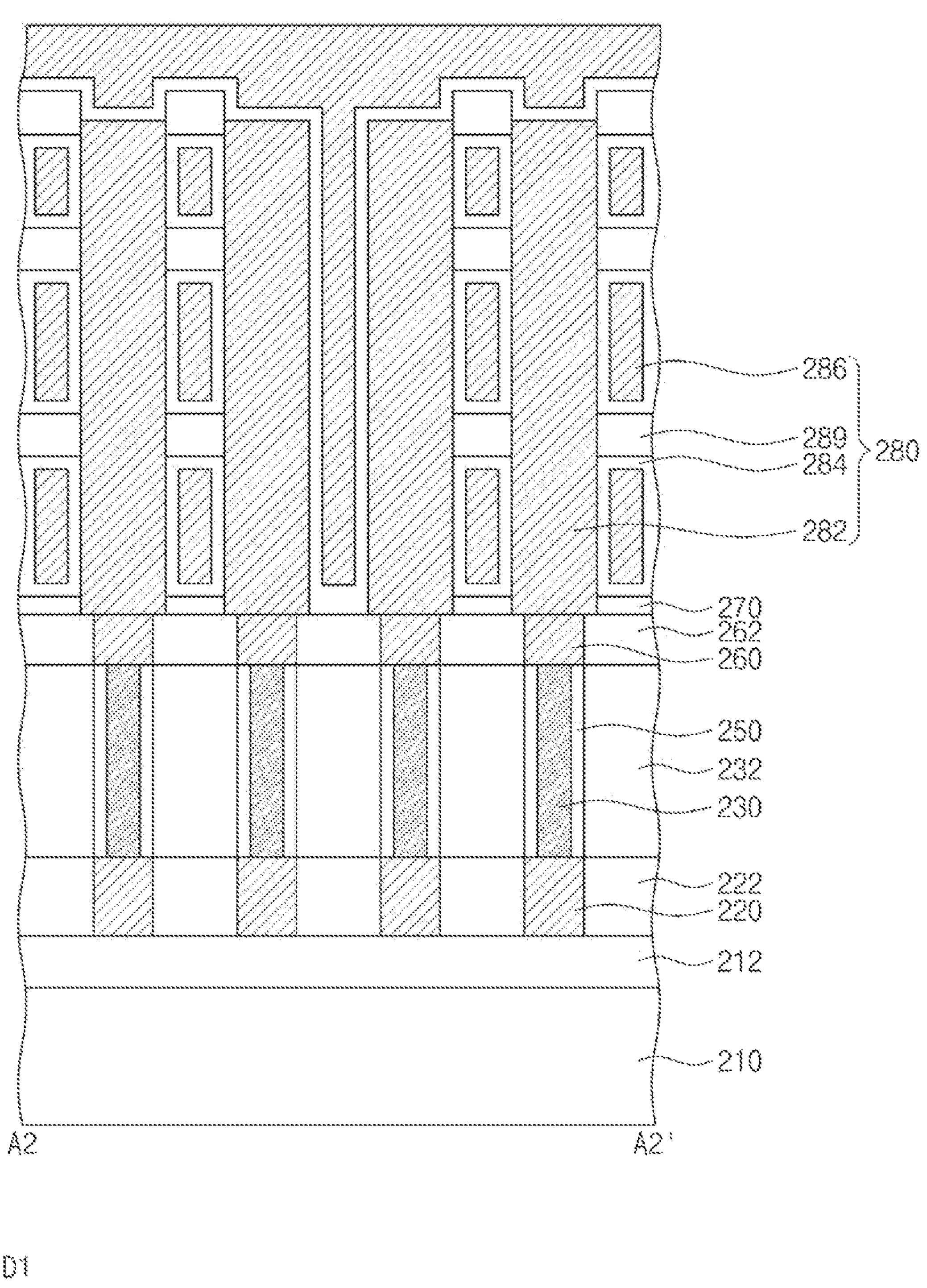
FIG. 8B illustrates a cross-sectional view taken along line A2-A2' of FIG. 8A.
Figure 8C:
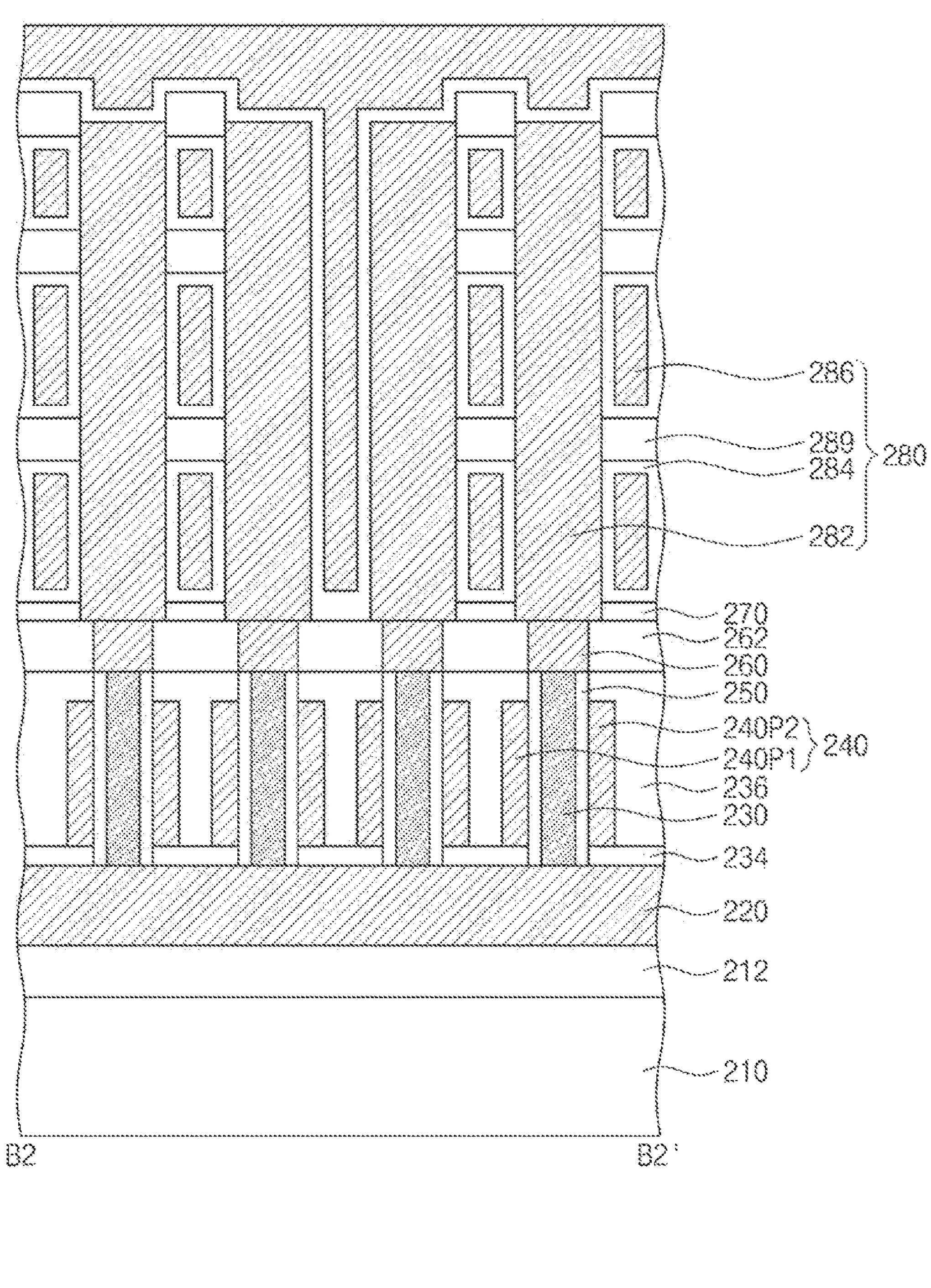
FIG. 8C illustrates a cross-sectional view taken along line B2-B2' of FIG. 8A.

FIG. 8A illustrates a perspective view showing a semiconductor device according to some example embodiments. FIG. 8B illustrates a cross-sectional view taken along line A2-A2' of FIG. 8A. FIG. 8C illustrates a cross-sectional view taken along line B2-B2' of FIG. 8A.

Referring to FIGS. 8A, 8B, and 8C, a semiconductor device 200 may include a substrate 210, a plurality of first conductive lines 220, a channel layer 230, a gate electrode 240, a gate dielectric layer 250, and a capacitor structure 280. The semiconductor device 200 may be a memory device including a vertical channel transistor (VCT). The vertical channel structure may indicate a structure in which a channel length of the channel layer 230 extends along a direction perpendicular to the substrate 210.

A lower dielectric layer 212 may be disposed on the substrate 210, and on the lower dielectric layer 212, the plurality of first conductive lines 220 may extend lengthwise in a second direction D2 while being spaced apart from each other in a first direction D1. The lower dielectric layer 212 may be provided thereon with a plurality of first dielectric structures 222 that fill a space between the plurality of first conductive lines 220. The plurality of first dielectric structures 222 may extend lengthwise in the second direction D2, and may have their top surfaces located at the same level as that of top surfaces of the plurality of first conductive lines 220. The plurality of first conductive lines 220 may serve as bit lines of the semiconductor device 200.

In some embodiments, the plurality of first conductive lines 220 may include doped polysilicon, metal, conductive metal nitride, conductive metal silicide, conductive metal oxide, or any combination thereof. For example, the plurality of first conductive lines 220 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concepts are not limited thereto. The plurality of first conductive lines 220 may include a single layer or multiple layers of the material mentioned above. In some embodiments, the plurality of first conductive lines 220 may include a two-dimensional semiconductor material, such as graphene, carbon nano-tube, or any combination thereof.

The channel layer 230 may be arranged in a matrix shape, or may be disposed spaced apart from each other in the first direction D1 and the second direction D2 on the plurality of first conductive lines 220. The channel layer 230 may have a first width in the first direction D1 and a first height in a third direction D3, and the first height may be greater than the first width. For example, the first height may be about 2 times to about 10 times the first width, but the present inventive concepts are not limited thereto. The channel layer 230 may have a bottom portion that serves as a first source/drain region (not shown), an upper portion that serves as a second source/drain region (not shown), a certain portion that lies between the first and second source/drain regions and serves as a channel region (not shown).

In some embodiments, the channel layer 230 may include an oxide semiconductor, such as $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or any combination thereof. The channel layer 230 may include a single layer or multiple layers of the oxide semiconductor discussed above. In some embodiments, the channel layer 230 may have a bandgap energy greater than that of silicon. For example, the channel layer 230 may have a bandgap energy of about 1.5 eV to about 5.6 eV. The channel layer 230 may have optimum channel performance when its bandgap energy ranges from about 2.0 eV to about 4.0 eV. The channel layer 230 may be polycrystalline or amorphous, but the present inventive concepts are not limited thereto. In some embodiments, the channel layer 230 may include a two-dimensional semiconductor material, such as graphene, carbon nano-tube, or any combination thereof.

The gate electrode 240 may extend lengthwise in the first direction D1 on opposite sidewalls of the channel layer 230. The gate electrode 240 may include a first sub-gate electrode 240P1 that faces a first sidewall of the channel layer 230 and a second sub-gate electrode 240P2 that faces a second sidewall of the channel layer 230, which second sidewall is opposite to the first sidewall. As one channel layer 230 is disposed between the first sub-gate electrode 240P1 and the second sub-gate electrode 240P2, the semiconductor device 200 may have a dual gate transistor structure. The present inventive concepts, however, are not limited thereto, and a single gate transistor structure may be achieved which does not include the second sub-gate electrode 240P2 and includes only the first sub-gate electrode 240P1 that faces the first sidewall of the channel layer 230.

The gate electrode 240 may include doped polysilicon, metal, conductive metal nitride, conductive metal silicide, conductive metal oxide, or any combination thereof. For example, the gate electrode 240 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concepts are not limited thereto.

The gate dielectric layer 250 may surround a sidewall of the channel layer 230 and may lie between the channel layer 230 and the gate electrode 240. For example, an entire sidewall of the channel layer 230 may be surrounded by the gate dielectric layer 250, and a portion of a sidewall of the gate electrode 240 may be in contact with the gate dielectric layer 250. In some embodiments, the gate dielectric layer 250 may extend in an extending direction of the gate electrode 240, and among sidewalls of the channel layer 230, only two sidewalls facing the gate electrode 240 may be in contact with the gate dielectric layer 250.

In some embodiments, the gate dielectric layer 250 may be formed of a silicon oxide layer, a silicon oxynitride layer, a high-k dielectric layer whose dielectric constant is greater than that of a silicon oxide layer, or a combination thereof. The high-k dielectric layer may be formed of metal oxide or metal oxynitride. For example, the high-k dielectric layer possibly used as the gate dielectric layer 250 may be formed of $HfO_2$, HfSiO, HfSiON, HfTaO, HfTiO, HfZrO, $ZrO_2$, $Al_2O_3$, or any combination thereof, but the present inventive concepts are not limited thereto.

A plurality of second dielectric structures 232 may extend along the second direction D2 on the plurality of first dielectric structures 222, and the channel layer 230 may be disposed between two neighboring ones among the plurality of second dielectric structures 232. In addition, between two neighboring second dielectric structures 232, a first buried layer 234 and a second buried layer 236 may be disposed in a space between two neighboring channel layers 230. The first buried layer 234 may be disposed on a bottom part of the space between two neighboring channel layers 230, and on the first buried layer 234, the second buried layer 236 may fill an unoccupied portion of the space between two neighboring channel layers 230. A top surface of the second buried layer 236 may be located at the same level as that of a top surface of the channel layer 230, and may cover a top surface of the gate electrode 240. Alternatively, the plurality of second dielectric structures 232 and the plurality of first dielectric structures 222 may be formed into a continuous material layer, or the second buried layer 236 and the first buried layer 234 may be formed into a continuous material layer.

A capacitor contact structure 260 may be disposed on the channel layer 230. The capacitor contact structures 260 may be disposed to overlap the channel layers 230, and may be arranged in a matrix shape or may be disposed spaced apart from each other in the first direction D1 and the second direction D2. For example, a lower surface of each of the capacitor contact structures 260 may contact an upper surface of a corresponding one of the channel layers 230. The capacitor contact structure 260 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof, but the present inventive concepts are not limited thereto. An upper dielectric layer 262 may surround a sidewall of the capacitor contact structure 260 on the plurality of second dielectric structures 232 and the second buried layer 236. For example, the upper dielectric layer 262 may be provided on the plurality of second dielectric structures 232 and the second buried layer 236, and may contact the sidewalls of the capacitor contact structures 260. In example embodiments, the upper dielectric layer 262 may contact the entire sidewall of each of the capacitor contact structures 260.

An etch stop layer 270 may be disposed on the upper dielectric layer 262, and a capacitor structure 280 may be disposed on the etch stop layer 270. The capacitor structure 280 may include bottom electrodes 282, a capacitor dielectric layer 284, a top electrode 286, and supporters 289.

The bottom electrode 282 may penetrate the etch stop layer 270 to come into electrical connection with a top surface of the capacitor contact structure 260. In some embodiments, the bottom electrodes 282 may be disposed to vertically overlap the capacitor contact structures 260, and may be arranged in a matrix shape or may be disposed spaced apart from each other in the first direction D1 and the second direction D2. For example, each of the bottom electrodes 282 may penetrate the etch stop layer 270, and may contact an upper surface of a corresponding one of the capacitor contact structures 260.

The top electrode 286 may include an interface layer on the capacitor dielectric layer 284 and an electrode layer on the interface layer. In some embodiments, the interface layer may include a first layer including molybdenum and oxygen and a second layer including molybdenum and nitride. In some embodiments, the electrode layer may include titanium and nitrogen.

In a semiconductor device according to some embodiments of the present inventive concepts, a capacitor dielectric layer may have a minimum ratio of monoclinic crystal structure, and thus may have increased capacitance.

Although the present invention has been described in connection with the example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:

a substrate;

a capacitor contact structure electrically connected to the substrate;

a bottom electrode connected to the capacitor contact structure;

a capacitor dielectric layer on the bottom electrode; and a top electrode on the capacitor dielectric layer, wherein the top electrode includes an interface layer on the capacitor dielectric layer and an electrode layer on the interface layer, wherein the interface layer includes a first layer on and directly contacting the capacitor dielectric layer and a second layer on and directly contacting the first layer, wherein the electrode layer directly contacts the second layer, wherein the capacitor dielectric layer includes hafnium oxide, wherein the first layer includes molybdenum titanium oxide, wherein the second layer includes molybdenum titanium nitride, wherein the electrode layer includes titanium and nitrogen, wherein a thickness of the interface layer is less than a thickness of the capacitor dielectric layer and a thickness of the electrode layer, wherein a concentration of titanium in the first layer is less than a concentration of molybdenum in the first layer, and wherein a concentration of titanium in the second layer is less than a concentration of molybdenum in the second layer.

2. The semiconductor device of claim 1, wherein the electrode layer includes titanium nitride.

3. The semiconductor device of claim 1, wherein the capacitor dielectric layer further includes an oxide other than hafnium oxide.

4. The semiconductor device of claim 3, wherein the oxide other than hafnium oxide includes zirconium oxide.

5. The semiconductor device of claim 1, wherein the thickness of the interface layer is equal to or less than 15 Å.

6. The semiconductor device of claim 1, further comprising a supporter that supports the bottom electrode.

7. A semiconductor device, comprising:

a substrate that includes an active pattern;

a bit-line structure electrically connected to the active pattern;

a capacitor contact structure electrically connected to the active pattern, a bottom electrode connected to the capacitor contact structure;

a supporter that supports the bottom electrode;

a capacitor dielectric layer that surrounds the supporter and the bottom electrode; and a top electrode that surrounds the capacitor dielectric layer, wherein the top electrode includes a first layer on and directly contacting the capacitor dielectric layer, a second layer on and directly contacting the first layer, and an electrode layer on and directly contacting the second layer, wherein the capacitor dielectric layer includes hafnium oxide, wherein the first layer includes molybdenum titanium oxide, wherein the second layer includes molybdenum titanium nitride, wherein the electrode layer includes titanium and nitrogen, wherein a sum of a thickness of the first layer and a thickness of the second layer is less than a thickness of the capacitor dielectric layer and a thickness of the electrode layer, wherein a concentration of titanium in the first layer is less than a concentration of molybdenum in the first layer, and wherein a concentration of titanium in the second layer is less than a concentration of molybdenum in the second layer.

8. The semiconductor device of claim 7, wherein the electrode layer includes titanium nitride.

9. The semiconductor device of claim 7, wherein the capacitor dielectric layer further includes zirconium oxide.

10. A semiconductor device, comprising:

a capacitor contact structure electrically connected to a substrate;

a bottom electrode connected to the capacitor contact structure;

a capacitor dielectric layer on and directly contacting the bottom electrode; and a top electrode on and directly contacting the capacitor dielectric layer, wherein the top electrode includes a first layer on and directly contacting the capacitor dielectric layer, and a second layer on and directly contacting the first layer, wherein the capacitor dielectric layer includes hafnium oxide, wherein the first layer includes molybdenum titanium oxide, and wherein the second layer includes molybdenum titanium nitride, wherein a concentration of titanium in the first layer is less than a concentration of molybdenum in the first layer, and wherein a concentration of titanium in the second layer is less than a concentration of molybdenum in the second layer.

11. The semiconductor device of claim 10, wherein the capacitor dielectric layer further includes an oxide other than hafnium oxide.

12. The semiconductor device of claim 11, wherein the oxide other than hafnium oxide includes zirconium oxide.

13. The semiconductor device of claim 10, wherein the top electrode further includes an electrode layer on and contacting the second layer, wherein the electrode layer includes titanium nitride, and
wherein a sum of a thickness of the first layer and a thickness of the second layer is less than a thickness of the capacitor dielectric layer and less than a thickness of the electrode layer.

14. The semiconductor device of claim 13, wherein the sum of the thickness of the first layer and the thickness of the second layer is equal to or less than 15 Å.

* * * * *